United States Patent
Wellig et al.

(10) Patent No.: US 7,457,377 B2
(45) Date of Patent: Nov. 25, 2008

(54) DEVICE FOR ESTIMATING A SEQUENCE OF N BITS CORRESPONDING TO A RECEIVED SEQUENCE OF M DIGITAL DATA AND ASSOCIATED METHODS

(75) Inventors: Armin Wellig, Satigny (CH); Julien Zory, Farges (FR)

(73) Assignee: STMicroelectronics N.V., Amsterdam (NL)

( * ) Notice: Subject to any disclaimer, the term of this patent is extended or adjusted under 35 U.S.C. 154(b) by 522 days.

(21) Appl. No.: 11/057,600

(22) Filed: Feb. 14, 2005

(65) Prior Publication Data

US 2005/0180531 A1    Aug. 18, 2005

(30) Foreign Application Priority Data

Feb. 17, 2004  (EP)  ................. 04290424

(51) Int. Cl.
*H03D 1/00* (2006.01)
*H03M 13/03* (2006.01)
(52) U.S. Cl. .............. 375/343; 375/341; 714/794
(58) Field of Classification Search ............ 375/343
See application file for complete search history.

(56) References Cited

U.S. PATENT DOCUMENTS

| | | | | |
|---|---|---|---|---|
| 4,933,956 A | | 6/1990 | Forney, Jr. | ............ 375/94 |
| 5,621,769 A | * | 4/1997 | Wan et al. | ............ 375/347 |
| 5,694,437 A | * | 12/1997 | Yang et al. | ............ 375/346 |
| 6,347,125 B1 | * | 2/2002 | Dent | ............ 375/341 |

OTHER PUBLICATIONS

"Soft-Decision Decoding of Binary Linear Block Codes Using T-Algorithm", Kokkonen et al., Proc. of the International Symposium on Personal, Indoor and Mobile Radio Communications 1997, Helsinki, Finland, sep. 1, 1997, pp. 1181-1185, XP010247633, ISBN: 0-7803-3871-5.

"Breadth-First Trellis Decoding with Adaptive Effort", SJ Simmons, IEEE Transactions on Communications, IEEE Inc. New York, US, vol. 38, No. 1, 1990 pp. 3-12, XP000102576, ISSN: 0090-6778.

"A Single Chip Viterbi Decoder for a Binary Convolutional Code using an Adaptive Algorithm" W-T Lee et al., IEEE Transactions on Consumer Electronics, IEEE Inc., New York, US, vol. 41, No. 1, Feb. 1, 1995, pp. 150-159, XP000529220, ISSN: 0098-3063.

"Efficient Piority-First Search maximum-Likelihood Soft-Decision Decoding of Linear Block Codes", IEEE Transactions of Information Theory, IEEE Inc., New York, US, vol. 39, No. 5, Sep. 1, 1993, pp. 1514-1523, XP000417580, ISSN: 0018-9448.

\* cited by examiner

*Primary Examiner*—Shuwang Liu
*Assistant Examiner*—David Huang
(74) *Attorney, Agent, or Firm*—Lisa K. Jorgenson; Allen, Dyer, Doppelt, Milbrath & Gilchrist, P.A.

(57) ABSTRACT

A system and method is provided for estimating a sequence of N bits ($\hat{x}_0 \hat{x}_1 \ldots \hat{x}_{N-1}$) corresponding to a received sequence of M digital data ($r_0 r_1 \ldots r_{M-1}$). The method includes determining candidate sequences of $M_{RS}$ digital data from a reduced reference sequence space comprising $2^{N_{RS}}$ reduced reference sequences of $M_{RS}$ reference digital data ($s_0 s_1 \ldots s_{M_{RS}-1}$), $M_{RS}$ being less than M, and $2^{N_{RS}}$ being less than or equal to $2^N$. The method further includes making up each candidate sequence with remaining reference symbols to obtain at least one complete candidate sequence of M digital data, and determining the sequence of N bits ($\hat{x}_0 \hat{x}_1 \ldots \hat{x}_{N-1}$) from the complete candidate sequences.

18 Claims, 7 Drawing Sheets

DEVICE FOR ESTIMATING A SEQUENCE OF N BITS CORRESPONDING TO A RECEIVED SEQUENCE OF M DIGITAL DATA AND ASSOCIATED METHODS

FIELD OF THE INVENTION

The invention relates to the field of wireless communications, and, more particularly to the 3GPP systems and related methods.

BACKGROUND OF THE INVENTION

The physical control layer contains information necessary to configure physical channel parameters at the receiving end of a wireless communication system. The control information needs to be decoded prior to the processing of the actual data samples composed of payload information provided by the higher layers. The control bits are either transmitted prior to the payload or in parallel. In general, to minimize the synchronization efforts and the size of latency buffers, and to reduce system throughput, the configuration, or reconfiguration of the receiver should be accomplished as fast as possible. Therefore, a latency constraint decoding and configuration problem should be addressed, where only a few bits, or control bits, are to be decoded as fast as possible.

The reliability of the control information should be guaranteed, since the remaining payload processing becomes obsolete in cases of erroneous control signaling. Error robustness can be guaranteed by adding redundancy to the control bits. Upon reception of the encoded control information, the receiver feeds the data into the corresponding decoder to recreate an exact copy of the originally transmitted control bits. The drawback is a considerable increase in processing complexity to implement the sophisticated algorithms. Moreover, the system designers can pick from various forward error correction techniques with different complexity and error correction characteristics. Forward error correction codes comprise linear block codes and convolutional codes.

The limited bandwidth of the air interface, coupled with the large amount of redundancy required to guarantee reliable transmission, limits the number of control bits to be transmitted. To further improve transmission reliability, a modulation scheme with advantageous distance properties among the different signal constellation points should be chosen. Simple modulation schemes such as BPSK (binary phase-shift keying) or QPSK (quaternary phase-shift keying) are ideal candidates for reliable transmission due to high SNR (signal-to-noise ratio) of adjacent symbols. However, with wireless systems becoming more and more complex, the need for smaller, faster and more power-efficient approaches is the key challenge of future system-on-chip designs.

Conventional approaches determine a sequence of bits from a reference sequence space comprising a large number of reference sequences, and that requires a correspondingly large memory size. Such a method is known in the art as maximum-likelihood sequence estimation (MLSE). Despite its exponential complexity, one key property of the MLSE decoding method is its inherent flexibility. That is, each sequence can be decoded in an optimal way no matter what encoding scheme was used. However, the MLSE decoding method requires a one-to-one mapping between the bits before and after encoding. As a result, it is necessary to unambiguously decode the sequence at the receiving side.

SUMMARY OF THE INVENTION

In view of the foregoing background, it is an object of the invention to provide a device and method capable of reducing the reference sequence space used.

The invention provides a method for estimating a sequence of N bits corresponding to a received sequence of M digital data. The method includes, a) determining the candidate sequences of $M_{RS}$ digital data from a reduced reference sequence space comprising $2^{N_{RS}}$ reduced reference sequences of $M_{RS}$ reference digital data, $M_{RS}$ being less than M, and $2^{N_{RS}}$ being less than or equal to $2^N$. The method further includes, b) making up each candidate sequence with the remaining reference digital data to obtain at least one complete candidate sequence of M digital data, and c) determining the sequence of N bits from all the complete candidate sequences.

The memory size is thus reduced, as well as the number of computations. The amount by which the search space can be reduced depends on the properties of the forward error correction codes.

The determining step a) may include calculating for each reduced reference sequence a first correlation energy from the reduced reference sequence, and the $M_{RS}$ first digital data of the received sequence. The determining step a) may further include determining a threshold from the maximum of all the calculated first correlation energies, and by taking into account the threshold for determining the candidate sequences.

In one embodiment, the threshold may be the maximum of all the calculated first correlation energies. In another embodiment, the threshold determining step may comprise determining the maximum of all the calculated first correlation energies, and making up the reduced reference sequence having the maximum of all the calculated first correlation energies, with a set of corresponding remaining reference sequences to obtain a complete reference sequence. The threshold determining step may further comprise calculating the correlation energy from the remaining $M-M_{RS}$ digital data of the received sequence and the remaining $M-M_{RS}$ digital data of the made up reduced reference sequence, and adding the maximum of all the calculated first correlation energies and the calculated correlation energy, in order to obtain the threshold.

In a preferred embodiment, the determining step a) may include calculating the maximum possible correlation energy from the remaining $M-M_{RS}$ digital data of the received sequence, and for each reduced reference sequence, adding its first correlation energy to the calculated maximum possible correlation energy, to obtain a second correlation energy. The determining step a) may further include comparing each second correlation energy with the threshold, and selecting as candidates the reduced sequences having their second correlation energy greater than the threshold.

The making up step b) may comprise, for each candidate sequence, reading a predetermined set of stored possible $M-M_{RS}$ remaining reference digital data, to obtain a complete candidate sequence of M digital data. The making up step b) may further comprise, for each candidate sequence, generating a set of possible $M-M_{RS}$ remaining reference digital data, to obtain a complete candidate sequence of M digital data.

In a preferred embodiment, the determining step c) may include calculating for each complete candidate sequence a complete correlation energy from the complete candidate sequence and the received sequence, selecting a complete candidate sequence having the highest complete correlation energy, and determining the sequence of N bits from the selected complete candidate. For instance, after the selected complete candidate sequence has been determined, the sequence of N bits is obtained by one-to-one demapping using a look-up table, for example.

The invention also provides a system for estimating a sequence of N bits corresponding to a received sequence of M digital data. The system may include a first determining means or first determiner for determining candidate sequences of $M_{RS}$ digital data from a reduced reference sequence space comprising $2^{N_{RS}}$ reduced reference sequences of $M_{RS}$ reference digital data, $M_{RS}$ being less than M, and $2^{N_{RS}}$ being less than or equal to $2^N$. The system may further include a making up means or assembler for making up each candidate sequence with remaining reference digital data to obtain at least one complete candidate sequence of M symbols, and a second determining means or second determiner for determining the sequence of N bits from all the complete candidate sequences.

In one embodiment, the first determining means may comprise a first calculating means or first calculator for calculating for each reduced reference sequence a first correlation energy from the reduced reference sequence and the $M_{RS}$ first digital data of the received sequence. The first determining means may further comprise a second calculating means or second calculator for determining a threshold from the maximum of the calculated first correlation energies, and a processing means or processor for determining the candidate sequences, taking into account the threshold.

In a first example, the second calculating means may be for calculating the threshold as the maximum of the calculated first correlation energies.

In a second example, the second calculating means may be for determining the maximum of the calculated first correlation energies, and making up the reduced reference sequence as having the maximum of the calculated first correlation energies, with a set of corresponding remaining reference sequences to obtain a complete reference sequence. The second calculating means may also be for calculating the correlation energy from the remaining $M-M_{RS}$ digital data of the received sequence ($r_0 r_1 \ldots r_{M-1}$), and the remaining $M-M_{RS}$ digital data of the made up reduced reference sequence, and adding the maximum of the calculated first correlation energies and the calculated correlation energy to obtain the threshold.

In another embodiment, the first determining means may comprise a third calculating means or third calculator for calculating the maximum possible correlation energy from the remaining $M-M_{RS}$ digital data of the received sequence, and an adding means or adder for adding, for each reduced reference sequence, its first correlation energy to the calculated maximum possible correlation energy, to obtain a second correlation energy. The first determining means may further comprise a processing means or processor that includes a comparing means or comparator for comparing each second correlation energy with the threshold, and a first selecting means or first selector for selecting as a candidate the reduced sequences having their second correlation energy greater than the threshold.

In a preferred embodiment, the making up means or assembler may comprise a memory for storing predetermined possible $M-M_{RS}$ remaining reference digital data, and a reading means or reader for reading, for each candidate sequence, the stored predetermined possible $M-M_{RS}$ remaining reference digital data, to obtain a complete candidate sequence of M digital data.

In another embodiment, the making up means may comprise generating means or a generator for generating, for each candidate sequence, a set of possible $M-M_{RS}$ remaining reference digital data, to obtain a complete candidate sequence of M digital data.

In a preferred embodiment, the second determining means may comprise a fourth calculating means or fourth calculator for calculating, for each complete candidate sequence, a complete correlation energy from the complete candidate sequence and the received sequence, a second selecting means or second selector for selecting a complete candidate sequence having the highest correlation energy, and a demapping means or demapper for determining the corresponding sequence of N bits from the selected complete candidate.

The system may further provide a receiving apparatus such as a cellular mobile phone. The receiving apparatus may incorporate a system as above defined.

DETAILED DESCRIPTION OF THE PREFERRED EMBODIMENTS

Figure 1:
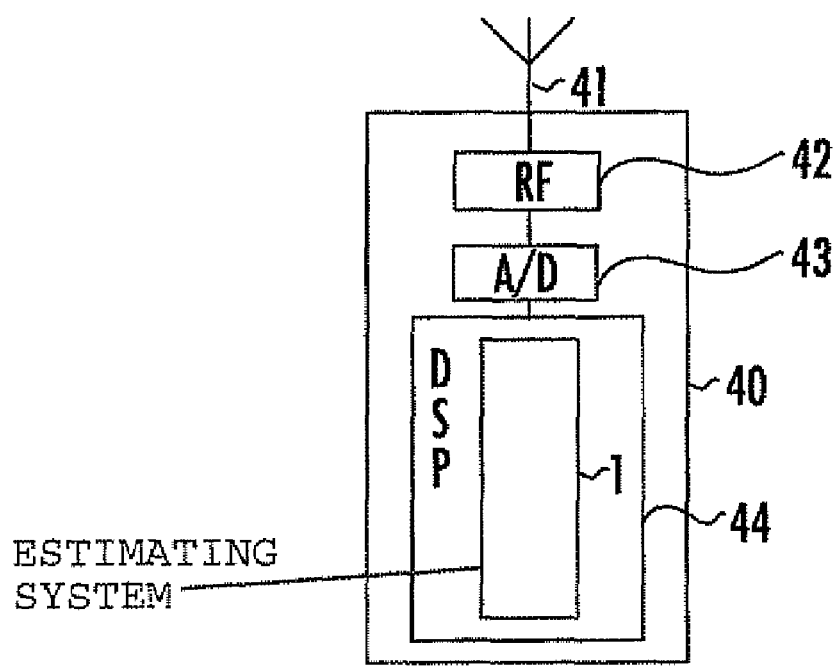
FIG. 1 is a block diagram of a cellular mobile phone with a system according to the invention.

Referring now to FIG. 1, a system is illustrated that incorporates a cellular mobile phone 40 in the reception chain, although the invention is not limited to this particular application. An interleaved signal is received by the antenna 41 and processed by the radio frequency stage 42 of the receiver. At the output of the RF stage 42, the signal is converted into the digital domain by an A/D converter 43. The converted signal is transmitted to a digital process stage 44 that comprises a system 1, and processes the digital base band signal. The system 1 estimates a sequence of N bits $\hat{x}_0 \hat{x}_1 \ldots \hat{x}_{N-1}$ corresponding to a received sequence of M digital data or "soft bits" $r_0 r_1 \ldots r_{M-1}$.

Figure 2:
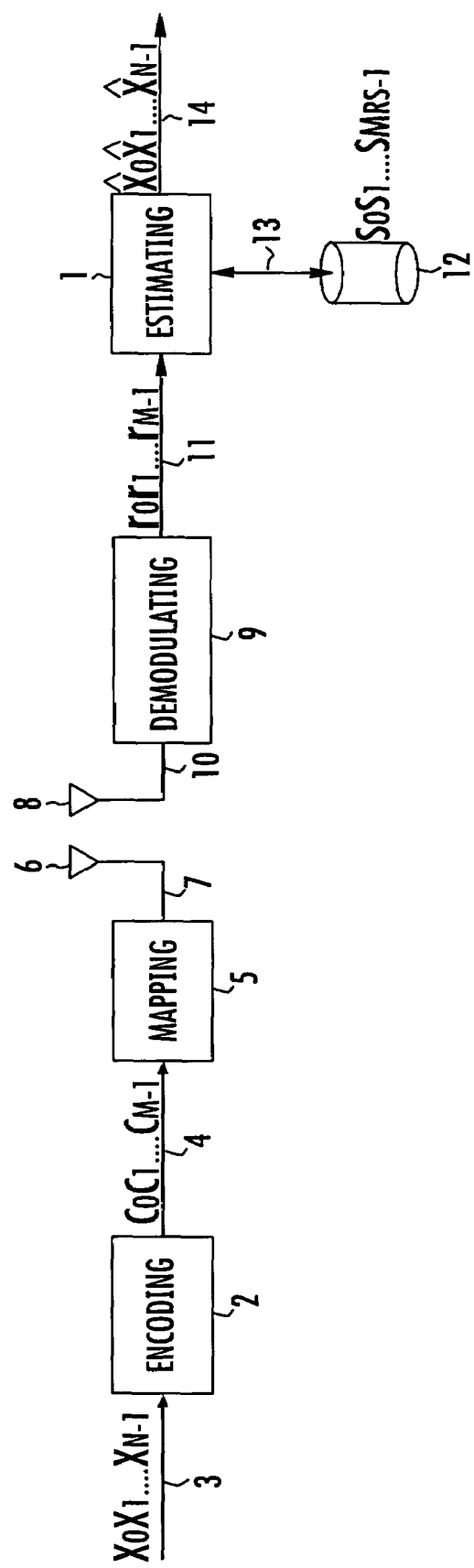
FIG. 2 is a block diagram of the system according to the invention.

Referring now to FIG. 2, a system of communication comprising an estimating system 1 is illustrated. An encoding module 2 receives a sequence $x_0 x_1 \ldots x_{N-1}$ of N bits by an input 3. The encoding module 2 outputs a corresponding encoded sequence $c_0 c_1 \ldots c_{M-1}$ of M bits, with an integer rate of encoding equal to n=M/N, and delivers the sequence through a connection 4 to a mapping module 5. The mapping module 5 outputs a corresponding mapped sequence of P symbols to the air by an antenna 6, where P equals to M divided by the number of encoded bits mapped to one constellation point, connected to the mapping module by a connection 7. A symbol is composed with a plurality of bits depending on the type of modulation used. The method applies to any modulation scheme, but hereinafter we limit our discussion to BPSK, i.e. P=M, and QPSK, i.e. P=M/2 complex symbols implying P=M symbols comprised of a real and imaginary part that can be treated independently.

On the receiving side, an antenna 8 receives the mapped sequence and transmits it to a demodulating module 9 by a connection 10 which outputs a corresponding sequence $r_0 r_1 \ldots r_{M-1}$ of M digital data or "soft bits", by a connection 11, to the estimating system 1. In other words, a digital data or "soft bit" corresponds to a binary information encoded on several hard bits depending on the required precision. The value of each digital data or "soft bit" varies theoretically from $-\infty$ to $+\infty$.

A memory 12 contains a predetermined reduced reference sequence space comprising $2^{N_{RS}}$ reduced reference sequences of $M_{RS}$ reference digital data $(s_0 s_1 \ldots s_{M_{RS}-1})$, $M_{RS}$ and $N_{RS}$ being predetermined and $M_{RS}$ being less than M, and $2^{N_{RS}}$ being less than or equal to $2^N$, which models the case of a convolutional encoder well. The reduced reference sequences of $M_{RS}$ reference digital data are encoded with values of 1 and −1, or with values 0 and 1, according to the embodiment. The memory 12 is connected to the estimating system 1 by a connection 13.

The estimating module 1 outputs a sequence $\hat{x}_0 \hat{x}_1 \ldots \hat{x}_{N-1}$ of N bits by an output 14, the sequence $\hat{x}_0 \hat{x}_1 \ldots \hat{x}_{N-1}$ corresponding to a received sequence $r_0 r_1 \ldots r_{M-1}$ of M digital data, and is an estimation of the initial sequence $x_0 x_1 \ldots x_{N-1}$ of N bits, for example.

Figure 3:
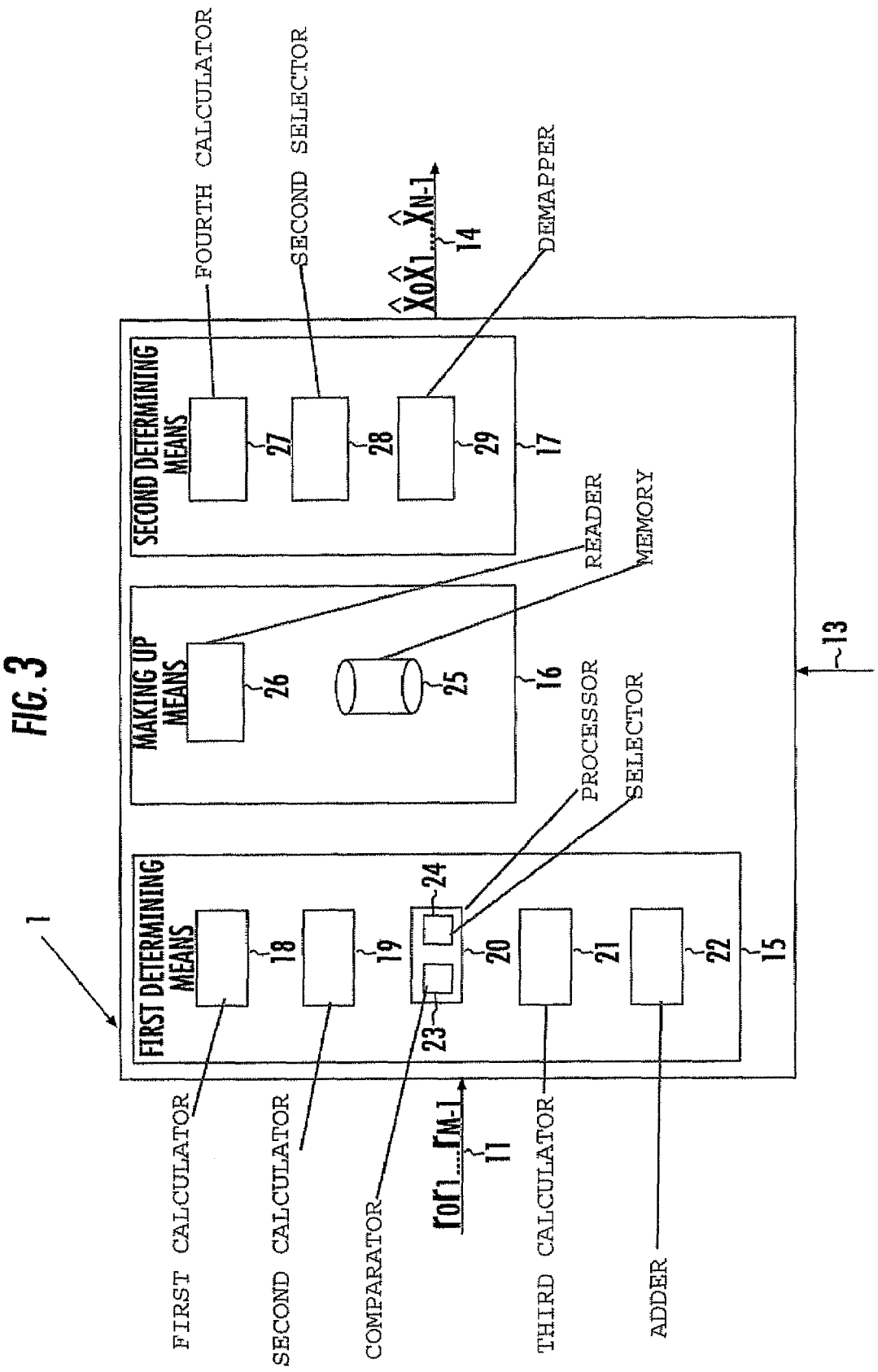
FIG. 3 is a block diagram of a first embodiment of the system shown in FIG. 2.

FIG. 3 illustrates an embodiment of the estimating system of FIG. 2. The estimating system 1 comprises a first determining means or first determiner 15 for determining candidate sequences of $M_{RS}$ digital data from the reduced reference sequence space of $2^{N_{RS}}$ reduced reference sequences of $M_{RS}$ reference digital data $(s_0 s_1 \ldots s_{M_{RS}-1})$. The estimating system 1 also comprises a making up means or assembler 16 for making up each candidate sequence with the remaining reference digital data to obtain at least one complete candidate sequence of M digital data. The estimating system 1 further comprises a second determining means or second determiner 17 for determining the sequence of N bits $(\hat{x}_0 \hat{x}_1 \ldots \hat{x}_{N-1})$ from all the complete candidate sequences, for example.

The first determining means 15 comprises a first calculating means or first calculator 18 for calculating for each reduced reference sequence a first correlation energy from the reduced reference sequence and the $M_{RS}$ first digital data of the received sequence $r_0 r_1 \ldots r_{M_{RS}-1}$.

The correlation energy of two sequences of k digital data is the sum of the products of the signed amplitudes of pairs of digital data having the same rank. The same notation is used for a digital data and its energy. Thus, the first calculating means 18 calculates a sequence of a first correlation energy from a reduced reference sequence and the $M_{RS}$ first digital data of the received sequence $r_0 r_1 \ldots r_{M_{RS}-1}$ with the expression:

$$\sum_{i=0}^{M_{RS}-1} r_i \cdot s_i$$

The first determining means 15 also comprises a second calculating means or second calculator 19 for determining a threshold from the maximum of all the calculated first correlation energies, and a processing means or processor 20 for determining the candidate sequences, taking into account the threshold, for example. The first determining means 15 further comprise third calculating means or third calculator 21 for calculating the maximum possible correlation energy $$E_{\max,end}^{M-M_{RS}}$$

from the remaining $M-M_{RS}$ digital data of the received sequence $r_0 r_1 \ldots r_{M-1}$. This maximum possible correlation energy $$E_{\max,end}^{M-M_{RS}}$$

is calculated, when a BPSK modulation is used with the relation:

$$E_{\max,end}^{M-M_{RS}} = \sum_{i=M_{RS}}^{M-1} |r_i|, \text{ because } |s_i| \le 1$$

The first determining means 15 also comprises adding means or adder 22 for adding, for each reduced reference sequence, its first correlation energy to the calculated maximum possible correlation energy $$E_{\max,end}^{M-M_{RS}},$$

to obtain a second correlation energy.

The processing means 20 comprises comparing means or comparator 23 for comparing each second correlation energy with the threshold, and first selecting means or first selector 24 for selecting as a candidate the reduced sequences having their second correlation energy greater than the threshold.

The making up means or assembler 16 comprises a memory 25 for storing predetermined possible $M-M_{RS}$ remaining reference digital data, and reading means or reader 26 for reading, for each candidate sequence, the stored predetermined possible $M-M_{RS}$ remaining reference digital data, to obtain a complete candidate sequence of M digital data. This may be used for a block of code, for example.

The second determining means 17 comprises a fourth calculating means or fourth calculator 27 for calculating, for each complete candidate sequence, a complete correlation energy from the complete candidate sequence and the received sequence $r_0 r_1 \ldots r_{M-1}$.

The second determining means 17 also comprises a second selecting means or second selector 28 for selecting a complete candidate sequence having the highest correlation energy, and demapping means or demapper 29 for determining the corresponding sequence of N bits $\hat{x}_0 \hat{x}_1 \ldots \hat{x}_{N-1}$ from the selected complete candidate. This demapping can be done done with a look-up table, for example.

Figure 4:
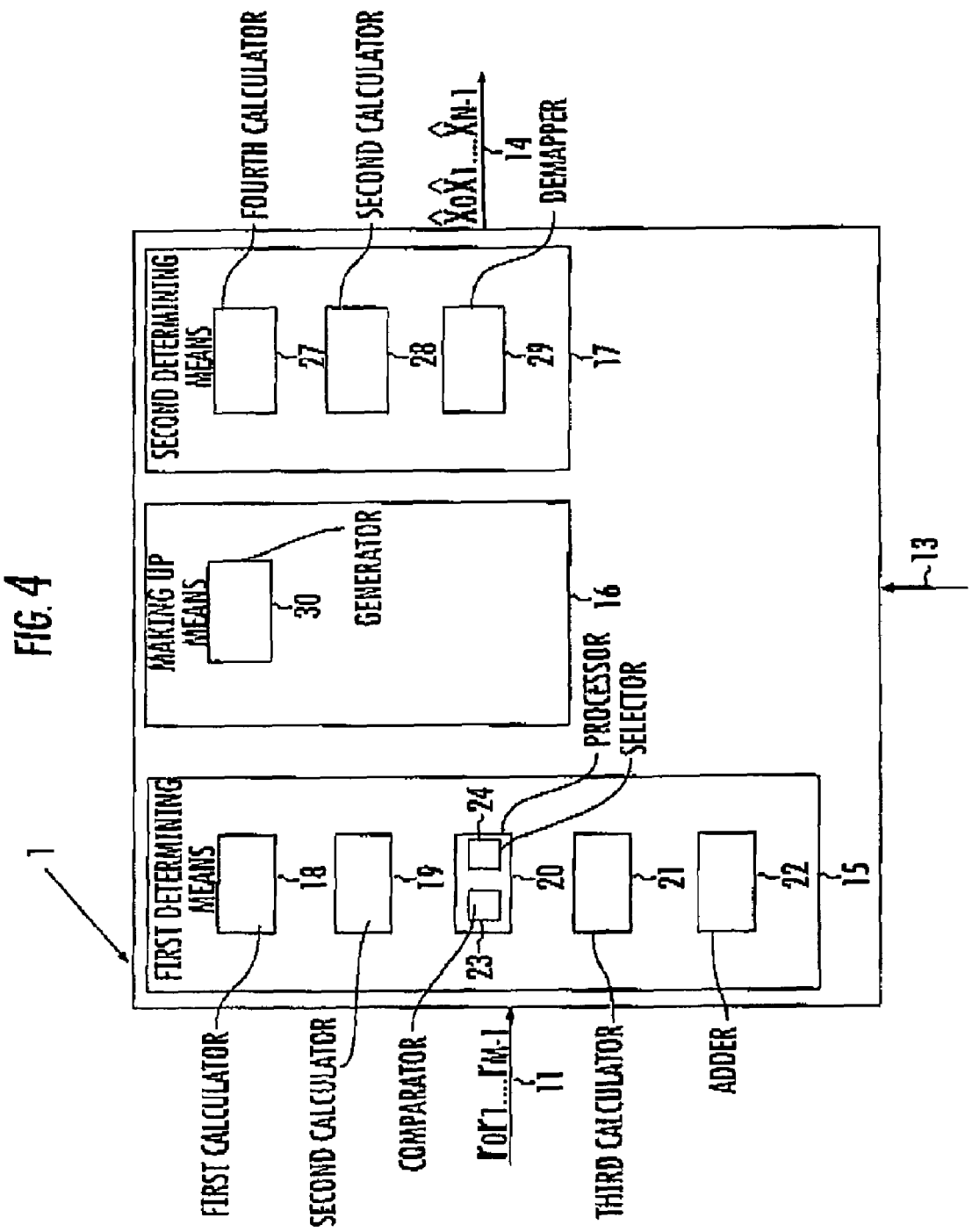
FIG. 4 is a block diagram of a second embodiment of the system shown in FIG. 2.

Referring to FIG. 4, when a convolutional code is used, the making up means 16 may comprise a generator means or generator 30 for generating, for each candidate sequence, a set of possible $M-M_{RS}$ remaining reference digital data, to obtain a complete candidate sequence of M digital data, instead of the memory 25 and the reading means or reader 26. Indeed, when a convolutional code is used, it is easy to generate, for each candidate sequence, a set of possible $M-M_{RS}$ remaining reference digital data, to obtain a complete candidate.

Figure 5:
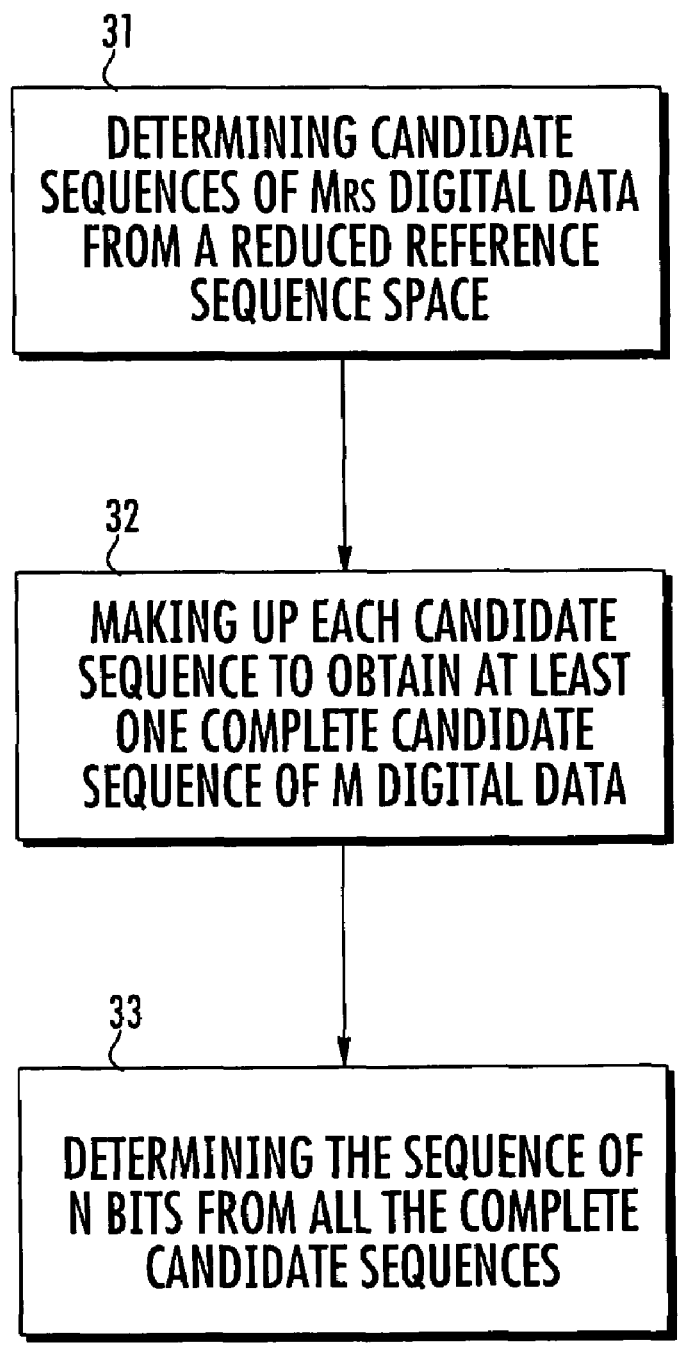
FIG. 5 is a flow chart illustrating a method according to the invention.

Referring to FIG. 5, a method aspect of the invention comprises determining the candidate sequences of $M_{RS}$ digital data from a reduced reference sequence space comprising $2^{N_{RS}}$ reduced reference sequences of $M_{RS}$ reference digital data $s_0 s_1 \ldots s_{M_{RS}-1}$ by the first determining means 15, at Block 31. The method also includes the making up means 16 making up each candidate sequence with the remaining reference digital data to obtain at least one complete candidate sequence of M digital data, at Block 32. The method further includes the second determining means 17 determining the sequence of N bits ($\hat{x}_0 \hat{x}_1 \ldots \hat{x}_{N-1}$) from all the complete candidate sequences, at Block 33.

Figure 6:
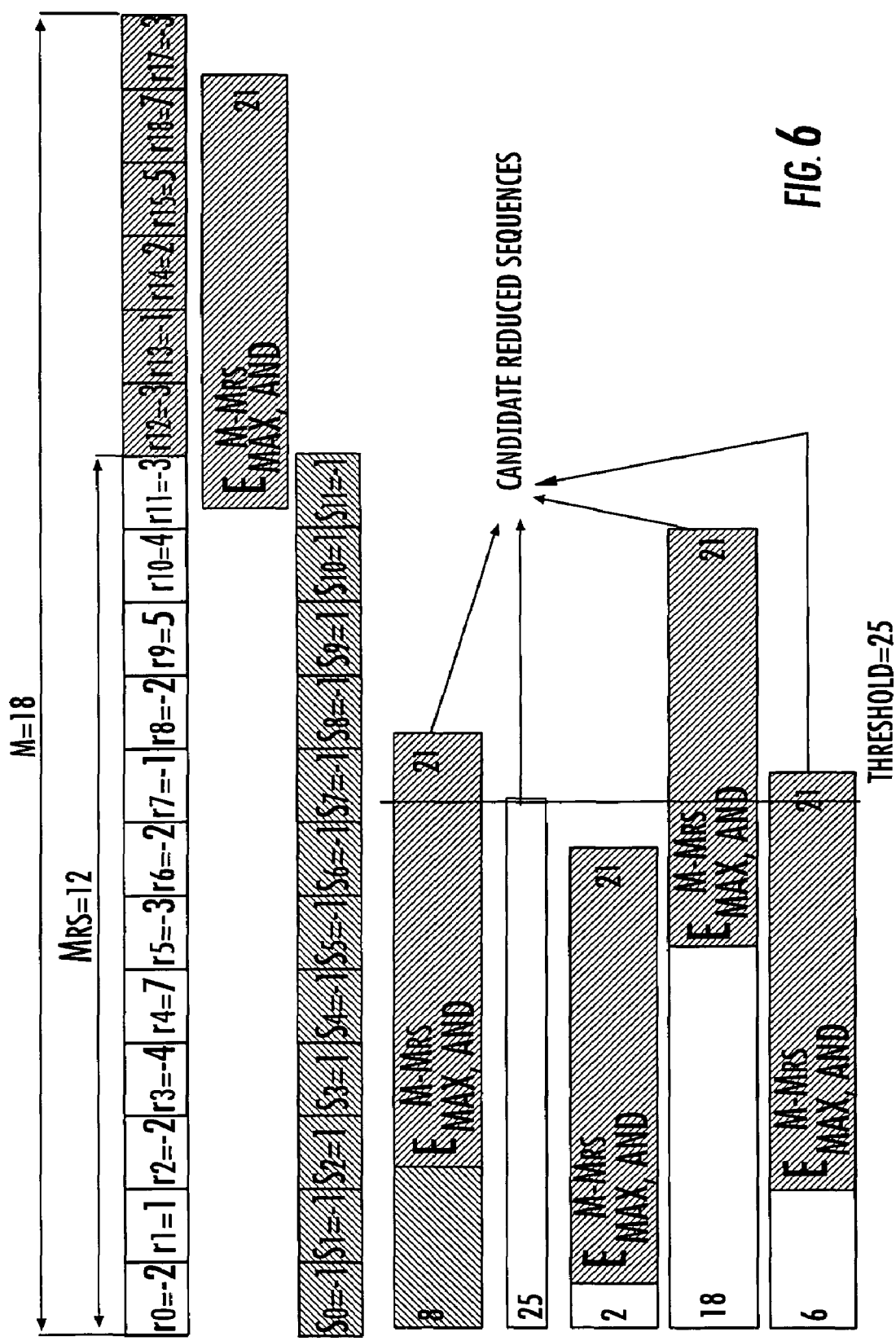
FIG. 6 is a block diagram of a first example of the method shown in FIG. 5.

The method as applied to a first exemplary case using a simple BPSK modulation scheme is illustrated in FIG. 6. Of course other modulation schemes are possible.

In this example where M=18, $M_{RS}$=12, and $r_0 r_1 \ldots r_{M-1}$ is:

$r_0$=−2; $r_1$=1; $r_2$=−2; $r_3$=−4; $r_4$=7; $r_5$=−3; $r_6$=−2; $r_7$=−1; $r_8$=−2, $r_9$=5; $r_{10}$=4; $r_{11}$=−3;

and $r_{12}$=−3; $r_{13}$=−1; $r_{14}$=2; $r_{15}$=5; $r_{16}$=7; $r_{17}$=−3.

For each reduced reference sequence $s_0 s_1 \ldots s_{M_{RS}-1}$ of $M_{RS}$ digital data, a calculation of a first correlation energy from the reduced reference sequence and the $M_{RS}$ first digital data of the received sequence $r_0 r_1 \ldots r_{M_{RS}-1}$ is done by the calculating means 18.

For instance, for a reduced reference sequence which for example is related to $N_{RS}$ bits comprised of $x_0$=1; $x_1$=0; $x_2$=0; $x_3$=0:

$s_0$=1; $s_1$=1; $s_2$=−1; $s_3$=−1; $s_4$=1; $s_5$=1; $s_6$=1; $s_7$=1; $s_8$=1, $s_9$=−1; $s_{10}$=−1; $s_{11}$=1;

the first correlation energy corresponding to the reduced reference sequence is:

$$\sum_{i=0}^{M_{RS}-1=11} r_i s_i = r_0 \cdot s_0 + r_1 \cdot s_1 + \ldots + r_{11} \cdot s_{11}$$

$$= (-1)\times(-2) + (-1)\times(1) + (1)\times(-2) + (1)\times(-4) +$$
$$(-1)\times(7) + (-1)\times(-3) + (-1)\times(-2) + (-1)\times(-1) +$$
$$(-1)\times(-2) + (1)\times(5) + (1)\times(4) + (-1)\times(-3)$$
$$= 2 - 1 - 2 - 4 - 7 + 3 + 2 + 1 + 2 + 5 + 4 + 3$$
$$= 8$$

This calculation is made for each reduced reference sequence of the reduced reference sequence space. In this example, the calculation is made for four other reduced reference sequences, with the following results. The respective first correlation energies are 25, 2, 18, and 6.

The second calculating means 19 then determines the threshold as being the maximum $$E^{M_{RS}}_{\max,beginning}$$

of all the calculated first correlation energies, here $$E^{M_{RS}}_{\max,beginning} = 25$$

for the reduced reference sequence having the first correlation energy equal to 25.

The third calculating means 21 calculates the maximum possible correlation energy $$E^{M-M_{RS}}_{\max,end},$$

represented on FIG. 6, from the remaining M-$M_{RS}$ digital data of the received sequence $r_0 r_1 \ldots r_{M-1}$, with the relation:

$$E^{M-M_{RS}}_{\max,end} = \sum_{i=M_{RS}}^{M-1} |r_i|$$

which in this example is:

$$E^{M-M_{RS}}_{\max,end} = \sum_{i=12}^{17} |r_i|$$
$$= |-3| + |-1| + |2| + |5| + |7| + |-3|$$
$$= 21.$$

Then adding means 22 adds, for each reduced reference sequence, its first correlation energy to the calculated maximum possible correlation energy $$E^{M-M_{RS}}_{\max,end} = 21,$$

to obtain a second correlation energy for each reduced reference sequence, this calculation not being necessary for the reduced reference sequence having its first correlation energy equal to the threshold 25. In this example, the respective second correlation energies calculated are 8+21=29, 25+21=46, 2+21=23, 18+21=39, and 6+21=27.

The comparing means 23 compares each second correlation energy with the threshold, and the first selecting means 24 selects as a candidate the reduced sequences having their second correlation energy greater than the threshold.

Thus, in this case, the first reduced sequence, having a second correlation energy equal to 29, the reduced sequence having a first correlation energy equal to $$E^{M_{RS}}_{\max,beginning} = 25,$$

and the two reduced sequences having a second correlation energy equal to 39 and to 27, are candidate reduced sequences.

Making up means 16 completes the candidate sequences, as described above, to obtain the complete candidate sequences of M digital data. In the case of convolutional code, a candidate sequence can be completed in several complete candidate sequences. Then for each complete candidate sequence, a complete correlation energy is calculated by the fourth calculating means 27.

In this example, the above reduced sequence:

$s_0$=1; $s_1$=1; $s_2$=−1; $s_3$=−1; $s_4$=1; $s_5$=1; $s_6$=1; $s_7$=1; $s_8$=1, $s_9$=−1; $s_{10}$=−1; $s_{11}$=1; is selected as a candidate and is for example made up with:

$s_{12}$=−1; $s_{13}$=1; $s_{14}$=−1; $s_{15}$=1; $s_{16}$=1; $s_{17}$=1.

Its complete correlation energy is then calculated with the relation:

$$\sum_{i=0}^{M-1} r_i s_i = \sum_{i=0}^{17} r_i s_i$$
$$= r_0 \cdot s_0 + r_1 \cdot s_1 + \ldots + r_{17} \cdot s_{17}$$
$$= (-1) \times (-2) + (-1) \times (1) + (1) \times (-2) + (1) \times (-4) + (-1) \times (7) + (-1) \times (-3) +$$
$$(-1) \times (-2) + (-1) \times (-1) + (-1) \times (-2) + (1) \times (5) + (1) \times (4) + (-1) \times (-3) +$$
$$(-1) \times (-3) + (1) \times (-1) +$$
$$(-1) \times (2) + (1) \times (5) + (1) \times (7) + (1) \times (-3)$$
$$= 2 - 1 - 2 - 4 - 7 + 3 + 2 + 1 + 2 + 5 + 4 + 3 + 3 - 1 - 2 + 5 + 7 - 3$$
$$= 17$$

This complete correlation energy is equal to the first correlation energy added with the correlation energy or the corresponding end of sequences. The first correlation energy of the candidates sequence can be stored to simplify the calculating of the complete correlation energies.

Among all the complete candidates sequences, the second selecting means 28 selects a complete candidate sequence having the highest correlation energy, and the demapping means 29 determines the corresponding sequence of $\hat{x}_0 \hat{x}_1 \ldots \hat{x}_{N-1}$ N bits from the selected complete candidate sequence. Furthermore, it is possible to directly store the bits instead of the symbols, because in BPSK, the mapping is 0→1 and 1→−1, or 0→−1 and 1→1, but in the computations it is necessary to use the corresponding digital data, to use the operator "multiplication" instead of "exclusive or".

Figure 7:
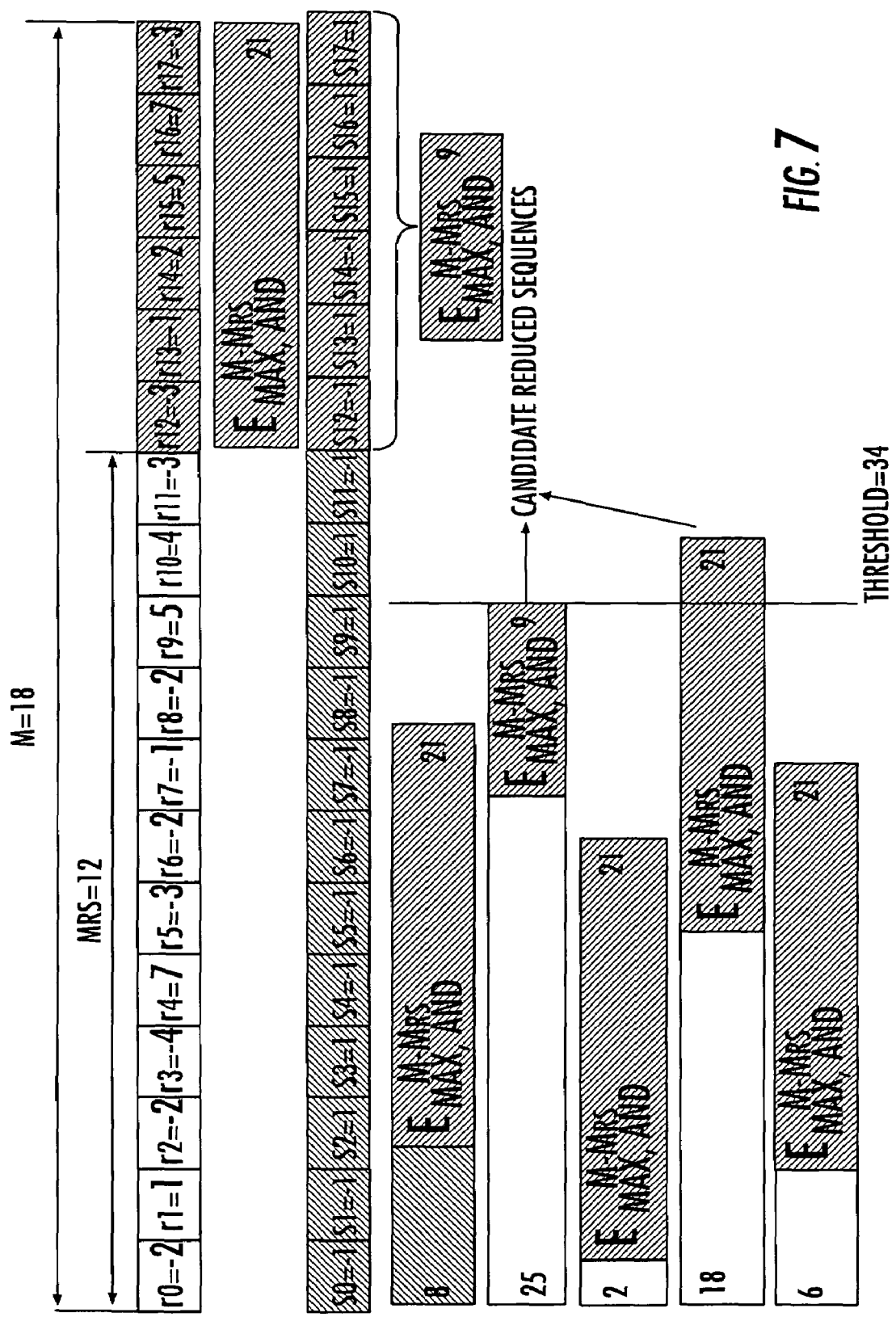
FIG. 7 is a block diagram of a second example of the method shown in FIG. 5.

FIG. 7 illustrates a second exemplary case using a simple BPSK modulation scheme, although other modulation schemes are possible. This case is similar to the preceding example illustrated in FIG. 6, but the threshold determination is different.

The calculating means 19 determines the maximum $$E_{max,beginning}^{M_{RS}}$$

of all the calculated first correlation energies, here $$E_{max,beginning}^{M_{RS}} = 25,$$

and for the reduced reference sequence having the first correlation energy equal to 25, which is obtained from the reference digital data corresponding to $N_{RS}$ bits. For example, when $x_0=1$, $x_1=0$, $x_2=1$, and $x_3=0$, the calculating means 19 is made up from this reduced reference sequence, according to the $N-N_{RS}$ remaining bits, for example, $x_4=1$, $x_5=1$, which correspond for example to the following, $s_{12}=-1$; $s_{13}=1$; $s_{14}=-1$; $s_{15}=1$; $s_{16}=1$; $s_{17}=1$.

For a block code, only one making up is possible, but in the case of a convolutional code, several making ups can be generated. Obviously, for a convolutional code, any one of the possible remaining $M-M_{RS}$ reference digital data, $s_{12}$, $s_{13}$, $s_{14}$, $s_{15}$, $s_{16}$, and $s_{17}$, can be used for the computation of the threshold.

The calculating means 19 calculates the correlation energy $$E_{end}^{M-M_{RS}}$$

from the remaining $M-M_{RS}$ digital data of the received sequence $r_0 r_1 \ldots r_{M-1}$, and the remaining $M-M_{RS}$ digital data of the made up reduced reference sequence, which is, in this case equal to:

$$\sum_{i=M_{RS}}^{M-1} r_i s_i = \sum_{i=12}^{17} r_i s_i$$
$$= (-1) \times (-3) + (1) \times (-1) +$$
$$(-1) \times (2) + (1) \times (5) + (1) \times (7) + (1) \times (-3)$$
$$= 3 - 1 - 2 + 5 + 7 - 3$$
$$= 9$$

Then the calculating means 19 calculates the threshold as being the sum of the maximum $$E_{max,beginning}^{M_{RS}}$$

and the correlation energy $$E_{end}^{M-M_{RS}}.$$

In this example, the threshold is equal to 25+9=34.

Nevertheless, an optimal method for a convolutional code is to calculate the correlation energy $$E_{end}^{M-M_{RS}}$$

from the $2^{N-N_{RS}}$ remaining $M-M_{RS}$ digital data for each possible remaining $M-M_{RS}$ digital data generated, and choose the maximum correlation energy. On the one hand, the computation is more complex, but on the other hand, fewer candidate sequences are selected, which in turn reduces the overall complexity.

The other steps of the method are the same as those described above, but because the value of the threshold is different, 34 instead of 25, fewer reduced sequences are selected as candidates. In comparison, with the threshold equal to 34, only two sequences are selected as candidates, whereas in the preceding case where the threshold is equal to 25, four sequences are selected as candidates.

In this case, the determining of the threshold is longer, but candidates sequences are less numerous, so the rest of the method is faster. Accordingly, the invention provides an optimal decoding algorithm, with a decrease in memory size used and computations made.

That which is claimed is:

1. A method for estimating a sequence of N bits ($\hat{x}_0 \hat{x}_1 \ldots \hat{x}_{N-1}$) corresponding to a received sequence of M digital data ($r_0 r_1 \ldots r_{M-1}$), the method comprising:
   a) determining candidate sequences of $M_{RS}$ digital data from a reduced reference sequence space comprising $2^{N_{RS}}$ reduced reference sequences of $M_{RS}$ reference digital data ($s_0 s_1 \ldots s_{M_{RS}-1}$), $M_{RS}$ being less than M, and $2^{N_{RS}}$ being less than or equal to $2^N$;
   b) making up each candidate sequence with the remaining reference digital data to obtain at least one complete candidate sequence of M digital data; and
   c) determining the sequence of N bits ($\hat{x}_0 \hat{x}_1 \ldots \hat{x}_{N-1}$) from the complete candidate sequences.

2. The method according to claim 1 wherein the step a) comprises:
   calculating for each reduced reference sequence a first correlation energy from the reduced reference sequence and the $M_{RS}$ first digital data of the received sequence ($r_0 r_1 \ldots r_{M_{RS}-1}$);
   determining a threshold from a maximum of the calculated first correlation energies; and
   taking into account the threshold for determining the candidate sequences.

3. The method according to claim 2 wherein the threshold is the maximum $$(E^{M_{RS}}_{\max,beginning})$$

of the calculated first correlation energies.

4. The method according to claim 2 wherein the threshold determining step comprises:
   determining the maximum $$(E^{M_{RS}}_{\max,beginning})$$

of the calculated first correlation energies;
   making up the reduced reference sequence having the maximum $$(E^{M_{RS}}_{\max,beginning})$$

of the calculated first correlation energies, with a set of corresponding remaining reference sequence to obtain a complete reference sequence;
   calculating a correlation energy $$(E^{M-M_{RS}}_{end})$$

from the remaining $M-M_{RS}$ digital data of the received sequence ($r_0 r_1 \ldots r_{M-1}$) and the remaining $M-M_{RS}$ digital data of the made up reduced reference sequence; and
   adding the maximum $$(E^{M_{RS}}_{\max,beginning})$$

of the calculated first correlation energies and the calculated correlation energy $$(E^{M-M_{RS}}_{end}),$$

to obtain the threshold.

5. The method according to claim 2 wherein the step a) comprises:
   calculating the maximum possible correlation energy $$(E^{M-M_{RS}}_{\max,end})$$

from the remaining $M-M_{RS}$ digital data of the received sequence ($r_0 r_1 \ldots r_{M-1}$);
   for each reduced reference sequence, adding its first correlation energy to the calculated maximum possible correlation energy $$(E^{M-M_{RS}}_{\max,end}),$$

to obtain a second correlation energy;
   comparing each second correlation energy with the threshold $$(E^{M_{RS}}_{\max,beginning});$$

and
   selecting as candidates the reduced sequences having their second correlation energy greater than the threshold $$(E^{M_{RS}}_{\max,beginning}).$$

6. The method according to claim 1 wherein the step b) comprises, for each candidate sequence, reading a predetermined set of stored possible $M-M_{RS}$ remaining reference digital data, to obtain a complete candidate sequence of M digital data.

7. The method according to claim 1 wherein the step b) comprises, for each candidate sequence, generating a set of possible $M-M_{RS}$ remaining reference digital data, to obtain a complete candidate sequence of M digital data.

8. The method according to claim 1 wherein the step c) comprises:
   calculating for each complete candidate sequence a complete correlation energy from the complete candidate sequence and the received sequence ($r_0 r_1 \ldots r_{M-1}$);
   selecting a complete candidate sequence having the highest complete correlation energy; and
   determining the sequence of N bits ($\hat{x}_0 \hat{x}_1 \ldots \hat{x}_{N-1}$) from the selected complete candidate.

9. A system for estimating a sequence of N bits ($\hat{x}_0 \hat{x}_1 \ldots \hat{x}_{N-1}$) corresponding to a received sequence of M digital data ($r_0 r_1 \ldots r_{M-1}$), the system comprising:
   a first determiner for determining candidate sequences of $M_{RS}$ digital data from a reduced reference sequence space comprising $2^{N_{RS}}$ reduced reference sequences of $M_{RS}$ reference digital data ($s_0 s_1 \ldots s_{M_{RS}-1}$), $M_{RS}$ being less than M, and $2^{N_{RS}}$ being less than or equal to $2^N$;

an assembler for making up each candidate sequence with remaining reference digital data to obtain at least one complete candidate sequence of M digital data; and a second determiner for determining the sequence of N bits ($\hat{x}_0 \hat{x}_1 \ldots \hat{x}_{N-1}$) from the complete candidate sequences.

10. The system according to claim 9, wherein said first determiner comprises a first calculator for calculating for each reduced reference sequence a first correlation energy from the reduced reference sequence and the $M_{RS}$ first digital data of the received sequence ($r_0 r_1 \ldots r_{M_{RS}-1}$);

a second calculator for determining a threshold from the maximum $$(E^{M_{RS}}_{\max,beginning})$$

of the calculated first correlation energies; and a processor for determining the candidate sequences, taking into account the threshold.

11. The system according to claim 10, wherein said second calculator is for calculating the threshold as being the maximum $$(E^{M_{RS}}_{\max,beginning})$$

of the calculated first correlation energies.

12. The system according to claim 11, wherein said second calculator is for determining the maximum $$(E^{M_{RS}}_{\max,beginning})$$

of the calculated first correlation energies;

making up the reduced reference sequence having the maximum $$(E^{M_{RS}}_{\max,beginning})$$

of the calculated first correlation energies, with a set of corresponding remaining reference sequence to obtain a complete reference sequence;

calculating a correlation energy $$(E^{M-M_{RS}}_{end})$$

from the remaining M-$M_{RS}$ digital data of the received sequence ($r_0 r_1 \ldots r_{M-1}$) and the remaining M-$M_{RS}$ digital data of the made up reduced reference sequence; and adding said maximum $$(E^{M_{RS}}_{\max,beginning})$$

of the calculated first correlation energies and the calculated correlation energy $$(E^{M-M_{RS}}_{end}),$$

in order to obtain the threshold.

13. The system according to claim 11 wherein said first determiner comprises:

a third calculator for calculating the maximum possible correlation energy $$(E^{M-M_{RS}}_{\max,end})$$

from the remaining M-$M_{RS}$ digital data of the received sequence ($r_0 r_1 \ldots r_{M-1}$); and an adder for adding, for each reduced reference sequence, its first correlation energy to the calculated maximum possible correlation energy $$(E^{M-M_{RS}}_{\max,end}),$$

to obtain a second correlation energy;

and wherein said processor comprises:

a comparator for comparing each second correlation energy with said threshold $$(E^{M_{RS}}_{\max,beginning});$$

and a first selector for selecting as a candidate the reduced sequences having their second correlation energy greater than the threshold $$(E^{M_{RS}}_{\max,beginning}).$$

14. The system according to claim 10 wherein said assembler comprises a memory for storing predetermined possible M-$M_{RS}$ remaining reference digital data, and a reader for reading, for each candidate sequence, the stored predetermined possible M-$M_{RS}$ remaining reference digital data, to obtain a complete candidate sequence of M digital data.

15. The system according to claim 10 wherein said assembler comprises a generator for generating, for each candidate sequence, a set of possible M-$M_{RS}$ remaining reference digital data, to obtain a complete candidate sequence of M digital data.

16. The system according to claim 10 wherein said second determiner comprises:

a fourth calculator for calculating, for each complete candidate sequence, a complete correlation energy from the complete candidate sequence and the received sequence ($r_0 r_1 \ldots r_{M-1}$);

a second selector for selecting a complete candidate sequence having the highest correlation energy; and a demapper for determining the corresponding sequence of N bits ($\hat{x}_0 \hat{x}_1 \ldots \hat{x}_{N-1}$) from the selected complete candidate.

17. A receiving apparatus comprising:

a system for estimating a sequence of N bits ($\hat{x}_0 \hat{x}_1 \ldots \hat{x}_{N-1}$) corresponding to a received sequence of M digital data ($r_0 r_1 \ldots r_{M-1}$), the system comprising:

a first determiner for determining candidate sequences of $M_{RS}$ digital data from a reduced reference sequence space comprising $2^{N_{RS}}$ reduced reference sequences of $M_{RS}$ reference digital data ($s_0 s_1 \ldots s_{M_{RS}-1}$), $M_{RS}$ being less than M, and $2^{N_{RS}}$ being less than or equal to $2^N$;

an assembler for making up each candidate sequence with remaining reference digital data to obtain at least one complete candidate sequence of M digital data; and a second determiner for determining the sequence of N bits ($\hat{x}_0 \hat{x}_1 \ldots \hat{x}_{N-1}$) from the complete candidate sequences.

18. The receiving apparatus according to claim 17 wherein said receiving apparatus comprises a cellular mobile phone.

* * * * *